(12) United States Patent
Druzhinin et al.

(10) Patent No.: US 9,335,800 B2
(45) Date of Patent: May 10, 2016

(54) COOLER FOR COMPUTING MODULES OF A COMPUTER

(71) Applicant: ZAO "RSC Technologies", Moscow (RU)

(72) Inventors: Egor A Druzhinin, Moscow (RU); Andrey A. Mihasev, Moscow (RU); Alexey B. Shmelev, Moscow (RU)

(73) Assignee: ZAO "RSC Technologies", Moscow (RU)

( * ) Notice: Subject to any disclaimer, the term of this patent is extended or adjusted under 35 U.S.C. 154(b) by 0 days.

(21) Appl. No.: 14/238,939

(22) PCT Filed: Feb. 7, 2013

(86) PCT No.: PCT/RU2013/000087
§ 371 (c)(1),
(2) Date: Feb. 14, 2014

(87) PCT Pub. No.: WO2014/065696
PCT Pub. Date: May 1, 2014

(65) Prior Publication Data
US 2015/0234438 A1  Aug. 20, 2015

(30) Foreign Application Priority Data
Oct. 26, 2012  (RU) .................. 2012145747

(51) Int. Cl.
*G06F 1/20* (2006.01)
*H05K 5/00* (2006.01)
*H05K 7/20* (2006.01)

(52) U.S. Cl.
CPC .............. *G06F 1/20* (2013.01); *H05K 7/20254* (2013.01)

(58) Field of Classification Search
CPC .......................... G06F 1/20; H05K 7/20254
USPC ............ 361/679.46–679.54, 688–723; 165/80.4, 80.5, 104.19, 104.33
See application file for complete search history.

(56) References Cited

U.S. PATENT DOCUMENTS

| | | | | |
|---|---|---|---|---|
| 4,551,787 A * | 11/1985 | Mittal | ................ | H01L 23/3672 257/E23.098 |
| 5,159,529 A * | 10/1992 | Lovgren | ............ | H05K 7/20636 165/185 |
| 2004/0104022 A1 * | 6/2004 | Kenny | .................... | F04B 17/00 165/299 |
| 2006/0021745 A1 * | 2/2006 | Fritze | ..................... | B29C 65/02 165/172 |
| 2006/0139882 A1 * | 6/2006 | Mikubo | ................ | H01L 23/473 361/699 |
| 2007/0062673 A1 * | 3/2007 | Olesen | ...................... | F28F 3/12 165/80.4 |
| 2008/0245506 A1 * | 10/2008 | Campbell | ................. | G06F 1/20 165/80.4 |
| 2008/0285230 A1 * | 11/2008 | Bojan | ................ | H05K 7/20872 361/689 |

(Continued)

*Primary Examiner* — Anthony Haughton
*Assistant Examiner* — Yahya Ahmad
(74) *Attorney, Agent, or Firm* — Inventa Capital PLC

(57) ABSTRACT

The present invention describes a cooling unit for a central processing unit (the CPU) that comprises two flat grooved plates fastened together that jointly form at least one channel that is sealed by hermetic insert blocks wherein the cooling liquid circulates. These plates have heat-dissipating properties for heat-generating electronic components of the CPU contacting with them, while the channel in which the cooling liquid circulates has an inlet and an outlet, to supply and discharge the cooling liquid, respectively. The technical result of the proposed technical solution is to increase the effectiveness and efficiency of a cooling system for the CPU, simplify its design, improve reliability characteristics, and reduce energy consumption of the cooling system.

9 Claims, 3 Drawing Sheets

(56) References Cited

U.S. PATENT DOCUMENTS

| | | | |
|---|---|---|---|
| 2009/0129011 A1* | 5/2009 | Balzano | H01L 23/473 361/689 |
| 2010/0296239 A1* | 11/2010 | Alyaser | F28D 15/00 361/679.53 |
| 2012/0087088 A1* | 4/2012 | Killion | F28D 15/0266 361/697 |
| 2012/0170222 A1* | 7/2012 | Dede | F28F 3/083 361/702 |
| 2014/0049908 A1* | 2/2014 | Eriksen | G06F 1/187 361/679.53 |

\* cited by examiner

COOLER FOR COMPUTING MODULES OF A COMPUTER

FIELD OF THE INVENTION

The invention relates generally to electrical engineering, particularly to devices for cooling the power supply units of computer processors.

BACKGROUND OF THE INVENTION

U.S. Pat. No. 6,457,514 of Oct. 1, 2002, IPC H05K7/20, describes a liquid cooled dissipator for electronic components characterized by selectively arranged dissipation fins, namely fins positioned only in proximity of the areas against which the electric components to cool are mounted.

The disadvantage of said device is in that local heat transfer rises in the areas where cooling modules have been installed because additional elements (fins, finned plates) are added to the flow of the cooling liquid resulting in increased hydraulic resistance of the coolant channels and the design costs.

Inventor's Certificate No. 1637051 of Mar. 23, 1991, IPC H05K 7/20, describes a radio electronic module unit that comprises a housing, circuit boards with several electronic components firmly affixed to one of their sides, and heat dissipater, consisting of laminated plates which form channels in which the cooling liquid circulates. In the module, circuit boards are connected to the heat dissipater with their unattached sides in order to increase composition density and improve heat transfer. The channels in which the cooling liquid circulates are located in the inner layer of the heat dissipater to ensure contact with the outer layers over their entire length and, in a longitudinal section, are structured in the form of a meander directed along the rows of electronic components.

The disadvantage of this invention is design that lacks effectiveness because heat is dissipated from the entire base surface and partially along the rows of electronic components.

The closest technical decision is a cooling device for power circuit modules, as described in Russian Patent No. 2273970 of Apr. 10, 2006, IPC H05K 7/20, which comprises a heat-dissipating base on which rows of heat-generating circuit modules and a lid are installed. The cooling device also includes channels in which the cooling agent circulates. The channels are structured in the form of a meander and the heat-dissipating base includes cavities made under the places where the electronic modules have been installed. The inserts installed in the cavities are connected with the lid and form the channels in which the cooling agent circulates. The channels are designed as straight-line portions and the meander sections that are interconnected and arranged in different planes. Each of these portions and sections is located in the cavity, wherein the channels are connected in a series-parallel pattern according to which the cooling liquid circulates. In order to mount electronic modules, the base has heat exchangers which go through the meander sections of the channels through which cooling liquid circulates. The heat exchanger portions located inside the channel are designed in the form of streamlined vanes, whereas in the places where the flow of the cooling liquid deflects and the cross sections of the channels in which the cooling liquid circulates is proportional to the power of the corresponding power electronic modules. The channels are equipped with rotary vanes. Thus, in order to reduce the hydraulic losses in each of the channels, the cross-sectional surface of the straight-line portions exceeds the cross-sectional surface of the meander sections. Furthermore, at least one of the channels in which the cooling liquid circulates, is equipped with a choke in order to balance the flow of the cooling liquid.

The cooling unit described above has the following disadvantages. The cooling agent heated after the first heat-generating electronic component is then passed to a second heat-generating electronic component. The process requires additional usage of the cooling liquid. This disadvantage is particularly evident when electronic components with different heat-generating parameters are used along the way the cooling liquid circulates. There are no structural elements that allow adjusting the supply volume of the cooling liquid for each electronic component individually and the speed of the cooling liquid in the channel, thus reducing the efficiency of heat transfer.

The technical result of the proposed technical solution is to increase the effectiveness and efficiency of a cooling system for a central processing unit (the CPU), simplify its design, improve reliability characteristics, and reduce energy consumption of the cooling system.

The technical result is achieved in that a cooling unit for the CPU comprises two flat grooved plates fastened together that jointly form at least one channel that is sealed by hermetic insert blocks and in which the cooling liquid circulates. These plates are heat-dissipating planes for heat-generating electronic components of the CPU that come into contact with them, while the channel in which the cooling liquid circulates has an inlet and an outlet, to supply and discharge the cooling liquid, respectively.

In this event, the electronic components of the CPU come into contact with flat plates directly through the pads and/or through various thermal interfaces. Accordingly, in a cutaway view, the channel in which the cooling liquid circulates may have the shape of a square, a rectangle, a circle, or an oval.

The flat grooved plates should preferably be mounted by fasteners or welded to each other. In this case, each flat plate has an insulated closed groove into which the hermetic insert blocks are mounted. In addition, two flat plates mounted together in their design may have fastening means for fastening the cooling unit to the wiring closet. The channel in which the cooling liquid circulates should preferably have a sequential pattern according to which the cooling liquid circulates.

In addition, an inlet and outlet must have the means to quickly connect hoses, pipes, or fittings, like John Guest fittings.

The operating principle of the cooling system for the CPU is to completely eliminate the heat gains generated in electronic components with the help of the cooling liquid. The cooling liquid moves along the channel preliminary formed in such a way as to reduce hydraulic losses and to level the temperature on the surface of the heat-generating components of the computer. A steady temperature of the computer components increases computer reliability as a whole. Energy savings are achieved by the following. The temperature of the insulated cooling liquid allows using atmospheric cooling and completely abandoning the Freon cooling systems and the like. The amount of cooling liquid that is required in order to remove the same heat gain is 4,000 times less than air volume equivalent in heat capacity. This is due to the heat capacity difference between different environments.

The cooling system suggested above comprises one or more cooling plates which are formed in such a way as to be connected to the heat-generating electronic components of the CPU directly or through different thermal interfaces. Among other electronic components, the cooling system is used to cool 2.5" disks or one 3.5" disk. The cooling plate is also used as a housing component and stiffens the structural integrity of the CPU.

The cooling liquid circulates inside the cooling plate in at least one channel. Thus, the cooling liquid removes heat gains from the surfaces of electronic components primarily due to contact heat transfer. The input and output of the cooling unit of the CPU are attached to the external liquid cooling system.

SUMMARY OF THE INVENTION

A cooling unit of the cooling system for the CPU comprises two halves that include channels in which the cooling liquid circulates, hermetic insert blocks, and heat-dissipating base that come into contact with heat-generating electronic components of the CPU directly or through various thermal interfaces. In order to cool the standard memory modules, a heat exchanger is used into the grooves of which memory modules are installed and fixed internally with the help of the thermal interfaces. The heat exchanger is mounted to the cooling unit of the CPU and heat transfer from the memory modules through the heat exchanger to the cooling unit is carried out via a contact process.

The channel wherein the cooling liquid circulates is made in the body of the cooling unit for the CPU in the form of a rectangular groove and has a consistent pattern wherein the cooling liquid circulates. The halves of the cooling unit (one or both) have two isolated closed channels for installation of hermetic insert blocks and have fasteners for mounting the cooling unit into the wiring closet.

BRIEF DESCRIPTION OF THE DRAWINGS

The invention will hereafter be described with reference to the drawings, where.

DETAILED DESCRIPTION OF THE PREFERRED EMBODIMENT

The cooling unit of the cooling system is be mounted to a central processing unit (the CPU) that is cooled with various well-known means. The indicated cooling unit for the CPU along with the standard memory modules and disks comprises two halves that include channels in which the cooling liquid circulates, hermetic insert blocks, and heat-dissipating bases on which thermal interfaces are installed that directly come into contact with heat-generating electronic components of the CPU. The channel wherein the cooling liquid circulates for the CPU, is made in the body of the halves (one or both) in the form of a rectangular groove and has a consistent pattern according to which the cooling liquid circulates. The halves of the cooling unit (one or both) have two isolated closed channels for installation of hermetic insert blocks and have fasteners for mounting the cooling unit into the wiring closet. The heat exchanger in the grooves of which the memory modules are installed and mounted inside with the help of the thermal interfaces is used for cooling the standard memory modules. The heat exchanger itself is mounted to the cooling unit of the CPU and heat transfer from the memory modules through the heat exchanger to the cooling unit is carried out via a contact process. Among other electronic components, the plate is used to cool two 2.5" disks or one 3.5" disk.

Figure 1:
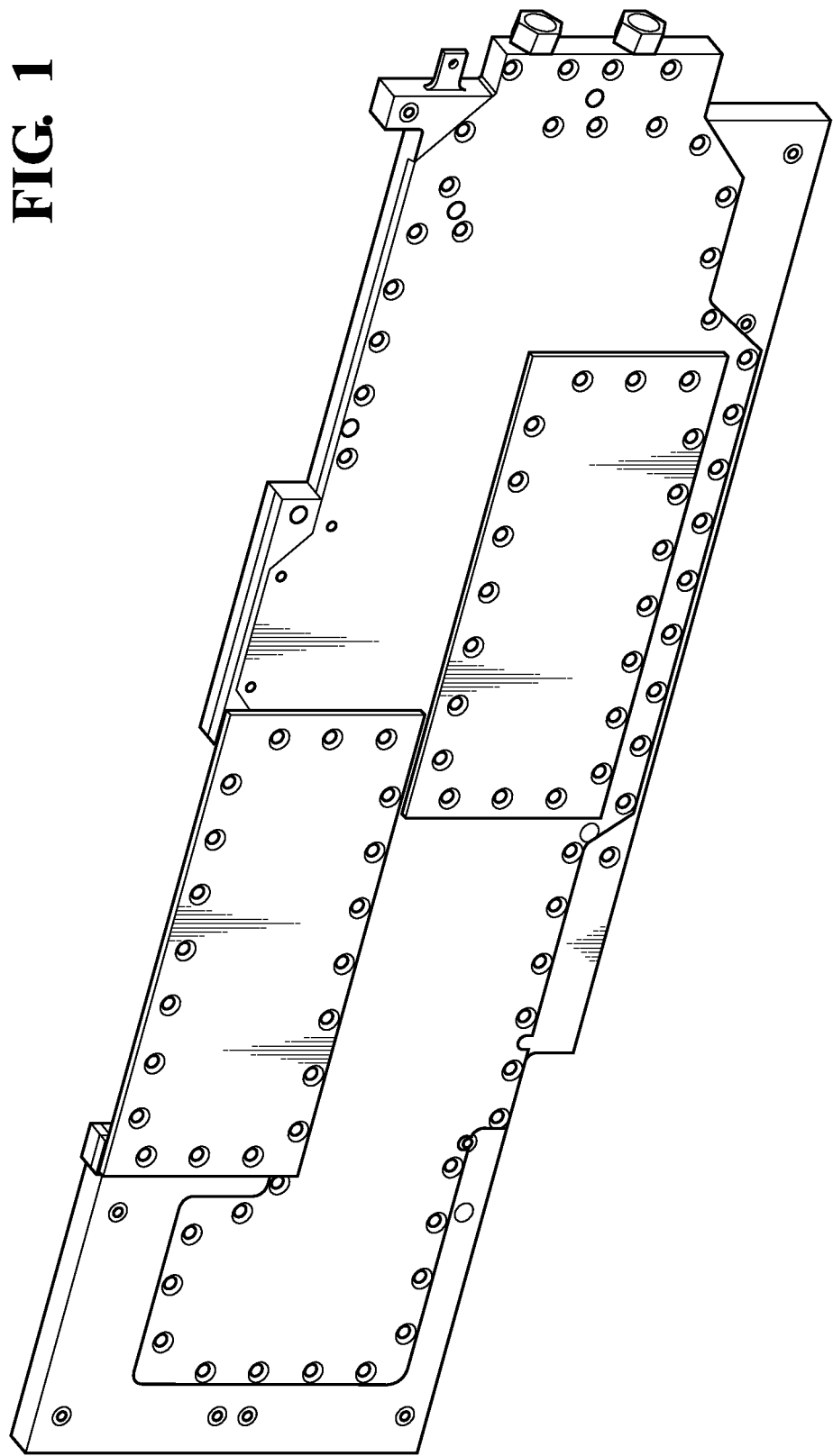
FIG. 1 is a general view of the cooling unit for the CPU.
Figure 2:
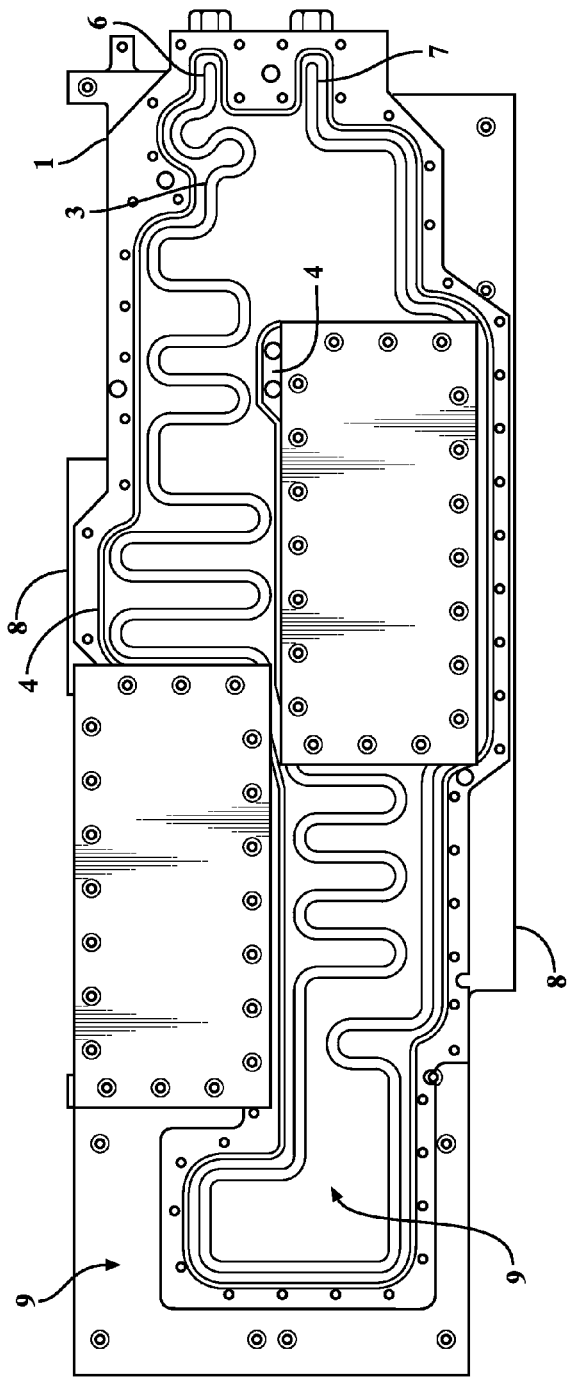
FIG. 2 is an inside view of the cooling unit.
Figure 3:
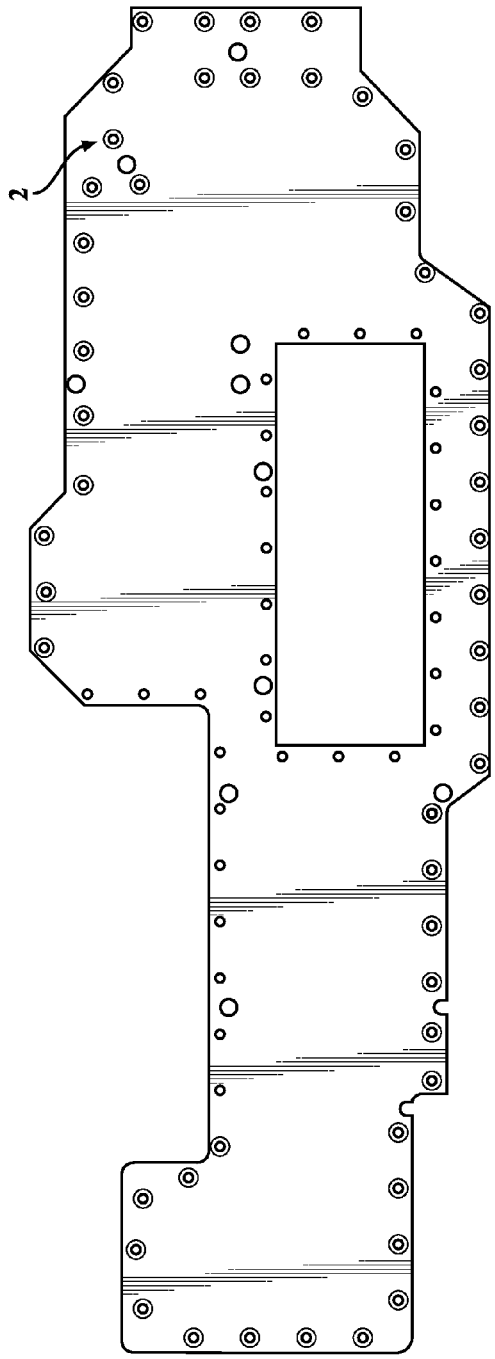
FIG. 3 is a view of one of the plates of the cooling unit.
Figure 4:
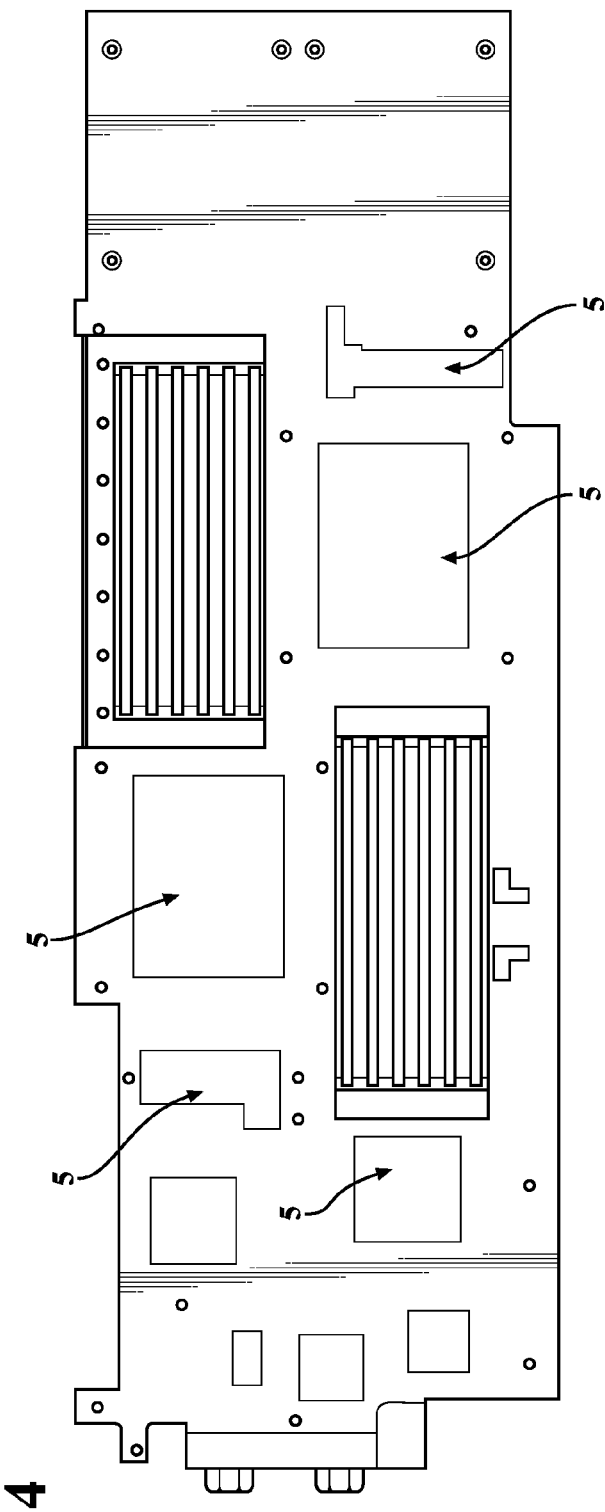
FIG. 4 illustrates various kinds of cooling pads to which the computer cooling elements are connected.
Figure 5:
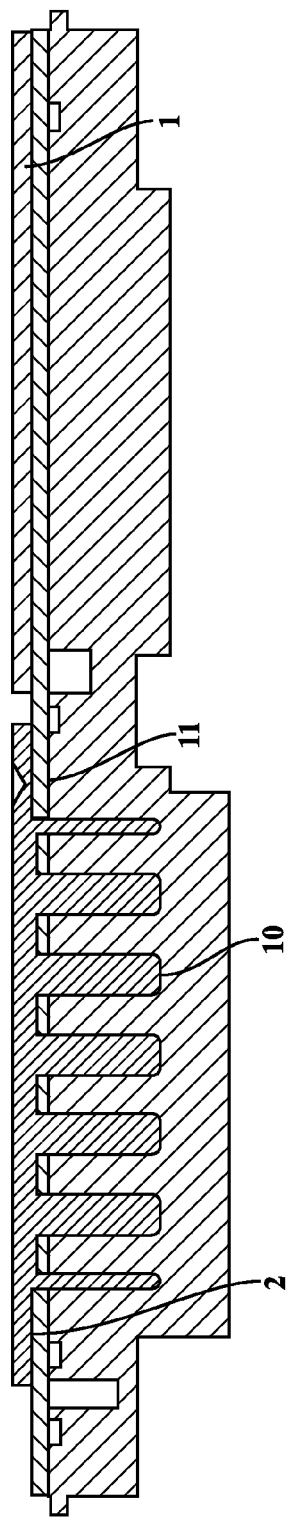
FIG. 5 is a general side view of the cooling unit

The cooling unit for CPUs is designed by milling two halves 1 and 2, as shown in FIGS. 2, 3, and 5, which include channels wherein the cooling liquid 3 circulates. To ensure the tightness of the channel, hermetic insert blocks in the form of rings made of resilient material are placed into the grooves 4, as shown in FIG. 2. There are heat exchangers on the outside of one of the halves 1 that come into contact with heat-generating electronic components 5 of the CPU, as shown in FIG. 4. In the side walls of the half 1 there are inlets 6 and outlets 7 for supply and discharge of the cooling liquid connected to the channel 3 in which the cooling agent circulates and closed with the half 2 by the hermetic insert blocks 4. As shown in FIG. 2, the half 1 include guiding members in order to install the cooling unit in the wiring closet 8. Among other electronic components, the plate is used to cool two 2.5" disks or one 3.5" disk 9 as shown in FIG. 2. FIG. 5 shows a cross-sectional view of the cooling unit of the CPU, which includes two halves 1 and 2 with installed heat exchanger for cooling standard memory modules 10, as shown in FIG. 5. The heat exchanger is mounted on the cooling unit using thermal interfaces 11.

The cooling unit for the CPU works as follows. Through the inlet 6 in the half 1, the cooling agent is supplied to the channel 3 formed by interconnected half 1 and half 2, wherein the cooling agent circulates through. The cooling agent is moving toward an arrow through the channel in which the cooling agent circulates. The channel is made in the body of the halves in the form of a rectangular groove and has a pattern according to which the cooling agent circulates, allowing to optimize the flow of the cooling agent and to improve the efficiency and effectiveness of the cooling unit.

Such a design wherein the channel is formed between the two halves allows to create an optimum cross-sectional shape, providing liquid passage at high speeds, to increase efficiency, and to simplify the design of the cooling unit, avoiding unnecessary hermetic gaskets. The heat exchanger in the grooves where memory modules are installed and fixed with the help of thermal interfaces, removes heat received from standard memory modules. The heat exchanger itself is mounted to the cooling unit of the CPU and heat transferred from the memory modules through the heat exchanger to the cooling unit, is carried out via a contact process.

As known to those skilled in the art, the generic aspects of the cooling unit for the CPU have been described above, various other modifications of the cooling devices, for example, when the plates are located differently relative to the CPU, etc., can be used with the present invention.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carring out this invention, but that the invention will include all embodiments falling within the scope of the appended claims.

The invention claimed is:

1. A cooling unit for a central processing unit (CPU) having a cab heat-generating electronic components, said cooling unit comprising: a first half presenting a side wall and a second half interconnected with one another to define at least one channel therebetween with cooling liquid circulating therethrough, said first half and said second half being heat-dissipating; at least one hermetic insert block placed in a groove defined between said first half and said second half to hermetically tight said at least one channel; said first half presenting inlet and outlet defined in said side wall and connected to said at least one channel for supply and discharge of the cooling liquid and closed with said second half by said hermetic insert blocks; and said first half and said second half contacting the heat-generating electronic components of CPU for cooling the heat-generating electronic components as the cooling liquid circulates through said at least one channel wherein the cooling liquid circulates by entering through said inlet and release through said outlet thereby supplying and discharging the cooling liquid, respectively, cooling a standard memory module spaced from said first half and extending through said second half and nested in a thermal interface.

2. The cooling unit as set forth in claim 1, wherein said first half and said second half are further defined by flat plates wherein the heat-generating electronic components of CPU come into contact with said flat plates of said first half and said second half directly or through various thermal interfaces.

3. The cooling unit as set forth in claim 1, wherein said at least one channel has at least one of a square shape, a rectangular shape, a circular shape, and an oval shape.

4. The cooling unit as set forth in claim 1, wherein the flat plates are mounted by fasteners or welded to each other.

5. The cooling unit as set forth in claim 1, wherein each of said flat plate has an insulated closed groove into which said hermetic insert blocks are mounted to.

6. The cooling unit as set forth in claim 1, wherein said flat plates mounted together have fastening means for fastening said cooling unit.

7. The cooling unit as set forth in claim 1, wherein said at least one channel in which the cooling liquid circulates has a sequential pattern for circulation of the cooling liquid.

8. The cooling unit as set forth in claim 1, wherein said first half and said second half having said groove including a rectangular configuration with a pattern according to which the cooling liquid circulates to optimize the flow of the cooling liquid thereby improving efficiency and effectiveness of said cooling unit.

9. A central processing unit (CPU) having a cooling unit comprising: heat-generating electronic components; a first half presenting a side wall and a second half interconnected with one another to define at least one channel therebetween with cooling liquid circulating therethrough, said first half and said second half being heat-dissipating, said first half and said second half are further defined by flat plates wherein the heat-generating electronic components of said CPU come into contact with said flat plates of said first half and said second half directly or through various thermal interfaces, said flat plates are mounted by fasteners or welded to each other, each of said flat plates has an insulated closed groove into which hermetic insert blocks are mounted to, said first half and said second half having said groove presenting a rectangular configuration with a pattern according to which the cooling liquid circulates to optimize the flow of the cooling liquid thereby improving efficiency and effectiveness of said cooling unit at least one hermetic insert block placed in a groove defined between said first half and said second half to hermetically tight said at least one channel; said first half presenting inlet and outlet defined in said side wall and connected to said at least one channel for supply and discharge of the cooling liquid and closed with said second half by said hermetic insert blocks; and said first half and said second half contacting the heat-generating electronic components of said CPU for cooling the heat-generating electronic component as the cooling liquid circulates through said at least one channel wherein the cooling liquid circulates by entering through said inlet and release through said outlet thereby supplying and discharging the cooling liquid, respectively, cooling a standard memory module spaced from said first half and extending through said second half and nested in a thermal interface.

* * * * *